(12) United States Patent
Kim (10) Patent No.: US 9,778,292 B2
(45) Date of Patent: Oct. 3, 2017

(54) APPARATUS FOR DETECTING NOISE IN POWER SUPPLY OF PLC ANALOGUE INPUT AND OUTPUT MODULE

(71) Applicant: LSIS CO., LTD., Anyang-si, Gyeonggi-do (KR)

(72) Inventor: Jung Wook Kim, Cheonan-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/983,305

(22) Filed: Dec. 29, 2015

(65) Prior Publication Data
US 2016/0216297 A1 Jul. 28, 2016

(30) Foreign Application Priority Data
Jan. 19, 2015 (KR) .......................... 10-2015-0008573

(51) Int. Cl.
*G01R 1/30* (2006.01)
*G01R 19/165* (2006.01)
*G01R 19/00* (2006.01)
*G01R 19/22* (2006.01)

(52) U.S. Cl.
CPC ... *G01R 19/16585* (2013.01); *G01R 19/0053* (2013.01); *G01R 19/0084* (2013.01); *G01R 19/16552* (2013.01); *G01R 19/22* (2013.01)

(58) Field of Classification Search
CPC .......... G01R 19/16585; G01R 19/0084; G01R 19/22; G01R 19/16552; G01R 19/0053
USPC ....................................... 324/124, 76.11, 123
See application file for complete search history.

(56) References Cited

U.S. PATENT DOCUMENTS

| | | | |
|---|---|---|---|
| 4,520,310 A * | 5/1985 | Kelly | G01R 15/09 324/115 |
| 4,692,692 A | 9/1987 | Prulhiere | |
| 4,694,193 A | 9/1987 | Schlenk et al. | |
| 5,119,073 A | 6/1992 | Nelson et al. | |

(Continued)

FOREIGN PATENT DOCUMENTS

| | | |
|---|---|---|
| JP | 03-082402 | 8/1991 |
| JP | 05-235660 | 9/1993 |

(Continued)

OTHER PUBLICATIONS

Japan Patent Office Application Serial No. 2016-006910, Office Action dated Sep. 6, 2016, 3 pages.

(Continued)

*Primary Examiner* — Giovanni Astacio-Oquendo
(74) *Attorney, Agent, or Firm* — Lee Hong Degerman Kang & Waimey (57) ABSTRACT

An apparatus for detecting noise in a power supply of a PLC analog input/output module is provided. The apparatus may include a capacitor configured to extract a noise determination target voltage from a driving voltage outputted from the power supply; a voltage conversion unit configured to convert the noise determination target voltage outputted from the capacitor and to output the converted noise determination target voltage; a comparison unit configured to compare the noise determination target voltage converted by the voltage conversion unit with a reference voltage; and a determination unit configured to determine whether the noise determination target voltage is a noise, based on a comparison result by the comparison unit.

6 Claims, 7 Drawing Sheets

WAVEFORM OF V5

(56) References Cited

U.S. PATENT DOCUMENTS

| | | | | |
|---|---|---|---|---|
| 5,289,166 | A * | 2/1994 | Cohen | G01R 19/16571 |
| | | | | 324/140 D |
| 5,479,095 | A * | 12/1995 | Michalek | G01R 33/02 |
| | | | | 324/115 |
| 6,864,745 | B2 * | 3/2005 | Ode | H03F 1/3247 |
| | | | | 330/136 |
| 7,949,372 | B2 * | 5/2011 | Lee | H04B 3/58 |
| | | | | 455/41.2 |
| 2003/0043027 | A1 * | 3/2003 | Carson | H04B 3/54 |
| | | | | 375/259 |
| 2014/0205026 | A1 * | 7/2014 | Smaini | H04B 3/54 |
| | | | | 375/257 |

FOREIGN PATENT DOCUMENTS

| | | |
|---|---|---|
| JP | 10-303991 | 11/1998 |
| JP | 2007310693 | 11/2007 |
| JP | 2010039739 | 2/2010 |

OTHER PUBLICATIONS

Zumbahlen, "Full Wave Rectifier," Analog Devices, Inc., Mini Tutorial MT-211, XP55279783, Jun. 2010, 3 pages.
Ducu, "Op AMP Rectifiers, Peak Detectors and Clamps," Microchip Technology Inc., AN1353, XP55279782, Jun. 2016, 8 pages.
Bryant, "Using Op Amps as Comparators," Analog Devices Inc., Application Note AN-849, XP552840481, Jun. 2016, 4 pages.
European Patent Office Application Serial No. 16150737.1, Search Report dated Jul. 1, 2016, 14 pages.

* cited by examiner

WAVEFORM OF V1

FIG. 4b

WAVEFORM OF V2

FIG. 4c

WAVEFORM OF V3

FIG. 4d

WAVEFORM OF V4

FIG. 4e

WAVEFORM OF V5

FIG. 4f

WAVEFORM OF V6

FIG. 4g

WAVEFORM OF V7

APPARATUS FOR DETECTING NOISE IN POWER SUPPLY OF PLC ANALOGUE INPUT AND OUTPUT MODULE

CROSS-REFERENCE TO RELATED APPLICATIONS

Pursuant to 35 U.S.C. §119(a), this application claims the benefit of earlier filing date and right of priority to Korean Patent Application No. 10-2015-0008573, filed on Jan. 19, 2015, the contents of which are all hereby incorporated by reference herein in its entirety.

BACKGROUND

Field of the Disclosure

The present disclosure relates to an apparatus for detecting noise in power supply of PLC analog input/output module. More particularly, the present disclosure relates to an apparatus for detecting noise in a power supply of a PLC analog input/output module which is capable of detecting whether a noise is introduced in electric power outputted by the power supply of the PLC analog input/output module.

Discussion of the Related Art

A PLC (Programmable Logic Controller) is a special computer capable of controlling various automated machines and processors. The PLC includes a memory storing programs and various data and may perform functions such as numerical calculation, logical calculation, sequencing control, timer, counter, etc.

The PLC may be applied to various operations such as device control, device numerical setting, time control, real-time monitoring, real time data collection and safe device activation.

The PLC includes an analog output module for providing signals to automation facility equipment, and an analog input module for receiving the signals output from the automation facility equipment. The analog input module plays a role of converting an analog signal delivered from the automation facility equipment into a digital signal and delivering the digital signal to an internal operation processing unit. In addition, the analog output module plays a role of receiving the digital signal from the operation processing unit, converting the digital signal into an analog signal and delivering the analog signal to the automation facility equipment.

Here, a power supply configured to supply electric power for operation of the analog input/output module is provided. The power supply converts electric power inputted from the outside to the electric power required for operation of the analog input/output module, and supplies the electric power to the analog input/output module.

Therefore, the electric power supplied by the power supply is required to be maintained stable, in order for the analog input/output module to be operated normally. In a case when a noise is introduced from the outside or a noise is generated in the PLC module, the output voltage of the power supply becomes unstable. When the unstable voltage is supplied to the analog input/output module, the analog input/output module can neither receive an accurate analog signal input nor output accurate analog signal. This phenomenon causes degradation in quality and performance of the product.

SUMMARY OF THE DISCLOSURE

Accordingly, the present disclosure is contrived to solve the foregoing disadvantages/problems of the related art, and an object of the present disclosure is to provide an apparatus for detecting noise in a power supply of a PLC analog input/output module which is capable of detecting whether a noise is introduced in electric power outputted by the power supply of the PLC analog input/output module.

In a general aspect of the present disclosure, an apparatus for detecting noise in a power supply of a PLC analog input/output module is provided, the apparatus comprising: a capacitor configured to extract a noise determination target voltage from a driving voltage outputted from the power supply; a voltage conversion unit configured to convert the noise determination target voltage outputted from the capacitor and to output the converted noise determination target voltage; a comparison unit configured to compare the noise determination target voltage converted by the voltage conversion unit with a reference voltage; and a determination unit configured to determine whether the noise determination target voltage is a noise, based on a comparison result by the comparison unit.

In some exemplary embodiments of the present disclosure, the voltage conversion unit may include: a half-wave rectifier configured to half-wave rectify the noise determination target voltage outputted from the capacitor; an inverting adder configured to invert and add the noise determination target voltage half-wave rectified by the half-wave rectifier; an inverting amplifier configured to output the noise detection determination target voltage inverted and added by the inverting adder in an inversed form of a same size; and a low pass filter configured to low-pass filter the noise determination target voltage inverted by the inverting amplifier.

In some exemplary embodiments of the present disclosure, the comparison unit may output a positive voltage or a negative voltage when the noise determination target voltage is higher than the reference voltage, or may output a negative voltage or a positive voltage when the noise determination target voltage is lower than the reference voltage.

In some exemplary embodiments of the present disclosure, the determination unit may output a high level voltage or a low level voltage when the noise determination target voltage is determined to be a noise, or may output a low level voltage or a high level voltage when the noise determination target voltage is determined not to be a noise.

In some exemplary embodiments of the present disclosure, the determination unit may be an NMOS (N-channel Metal-Oxide-Semiconductor) FET (Field Effect Transistor) or a PMOS (P-channel MOS) FET configured to be turned on or turned off, according to the comparison result outputted from the comparison unit.

According to an exemplary embodiment of the present disclosure, the apparatus for detecting noise in a power supply of a PLC analog input/output module may detect whether a noise is introduced in electric power outputted by the power supply of the PLC analog input/output module, when the power supply for supplying electric power to the PLC analog input/output module outputs an unstable voltage due to noise.

Therefore, the noise introduced in electric power supplied by the power supply for supplying the electric power to the PLC analog input/output module is detected in advance, so that the noise may be prevented from being supplied to the PLC analog input/output module.

As apparent from the foregoing, the malfunction occurrence rate of the PLC analog input/output module may be reduced, and thereby time and cost consumed in trouble shooting can also be reduced.

DETAILED DESCRIPTION

Advantages and features of the present disclosure and methods to implement them will now be described more fully hereinafter with reference to exemplary embodiments accompanied by drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The scope of the present disclosure shall be defined only by the scope of claims. The same reference numbers indicate the same components throughout the specification. In the attached figures, the thickness of layers and regions may be exaggerated for clarity.

When it is determined that a detailed description about known function or structure relating to the present disclosure may evade the main point of the present disclosure, the detailed description may be omitted. In addition, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Figure 1:
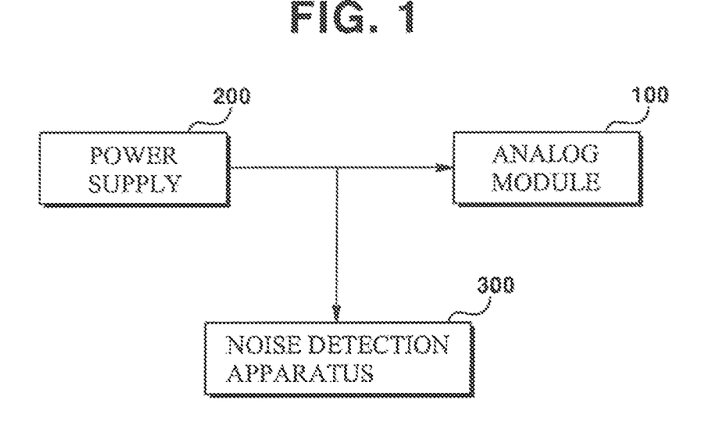
FIG. 1 is a block diagram illustrating an example of a PLC system including an apparatus for detecting noise in a power supply of a PLC analog input/output module according to an exemplary embodiment of the present disclosure.

FIG. 1 is a block diagram illustrating an example of a PLC system including an apparatus for detecting noise in a power supply of a PLC analog input/output module according to an exemplary embodiment of the present disclosure.

Referring to FIG. 1, the PLC system may include an analog module (100), a power supply (200) and a noise detection apparatus (300), and may further include other components. However, only components required for description of the present disclosure are illustrated herein.

Here, the analog module (100) may be an analog input module configured to convert an analog signal provided from a sub-device to a digital signal and provide the digital signal to an internal calculation process unit, and may be an analog output module configured to receive a digital signal reflecting a calculation process result provided by the calculation process unit, convert the digital signal to an analog signal, and provide the analog signal to the sub-device.

The power supply (200) is a structure in order to supply a driving electric power required for driving the analog module (200). The power supply (200) convert electric power applied from the outside to an electric power of appropriate level for driving the analog module (100), and may provide the converted electric power to the analog module (100).

Meanwhile, the noise detection apparatus (300) may detect whether a noise is introduced in electric power outputted from the power supply (200). The structure of the noise detection apparatus (300) will be described hereinafter based on the enclosed drawings.

Figure 2:
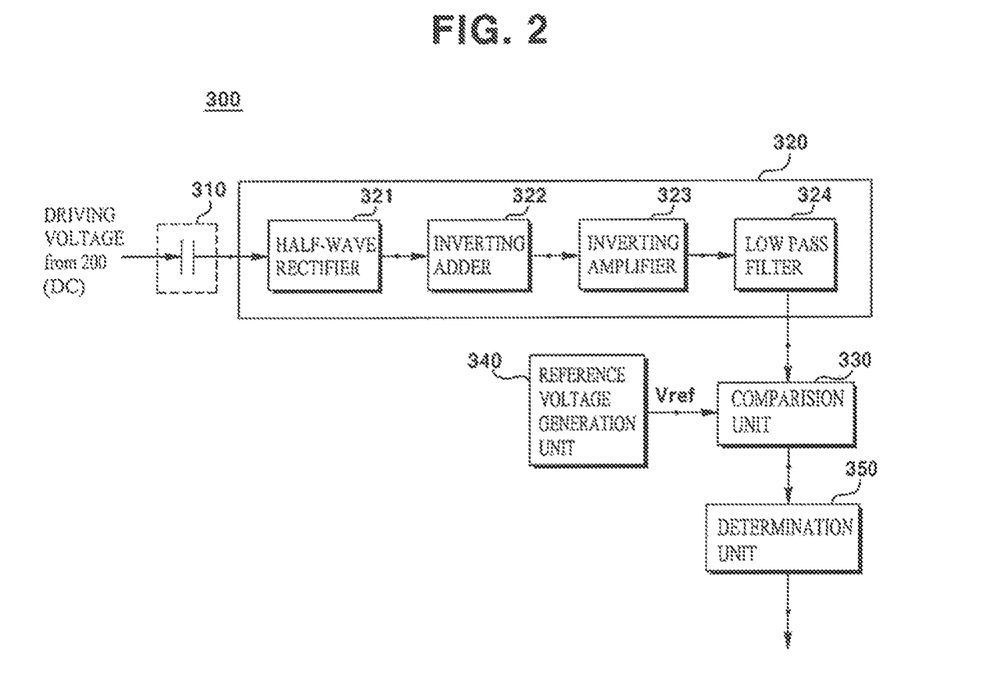
FIG. 2 is a block diagram illustrating an apparatus for detecting noise in a power supply of a PLC analog input/output module according to an exemplary embodiment of the present disclosure.
Figure 3:
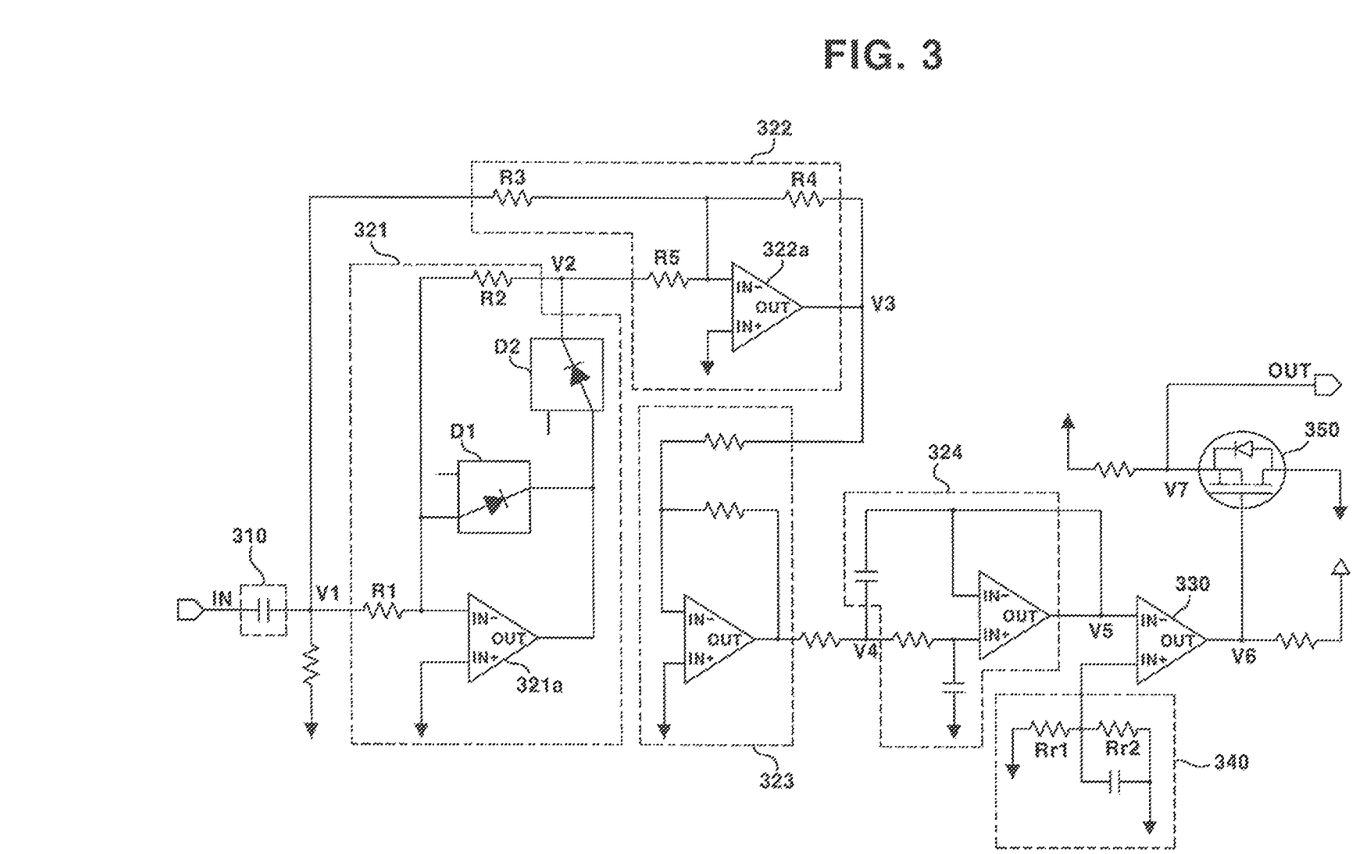
FIG. 3 is a detailed circuit diagram of a PLC analog input/output module according to an exemplary embodiment of the present disclosure.

FIG. 2 is a block diagram illustrating an apparatus for detecting noise in a power supply of a PLC analog input/output module according to an exemplary embodiment of the present disclosure; FIG. 3 is a detailed circuit diagram of a PLC analog input/output module according to an exemplary embodiment of the present disclosure; and FIG. 4a, FIG. 4b, FIG. 4c, FIG. 4d, FIG. 4e, FIG. 4f, and FIG. 4g are views illustrating an example of output voltage waveform of each partial structure of an apparatus for detecting noise in a power supply of a PLC analog input/output module according to an exemplary embodiment of the present disclosure.

Referring to FIGS. 2 to 4g, the apparatus (300) for detecting noise in a power supply of a PLC analog input/output module according to an exemplary embodiment of the present disclosure may include a capacitor (310), a voltage conversion unit (320), a comparison unit (330), a reference voltage generation unit (340) and a determination unit (350).

The capacitor (310) may be configured to extract a noise from a driving voltage outputted from the power supply (200).

That is, the capacitor (310) has a characteristic to block direct current ingredients, and the driving voltage is of direct current. Therefore, the output voltage of the capacitor (310) becomes '0', unless a noise is included in the driving current.

Figure 4A:
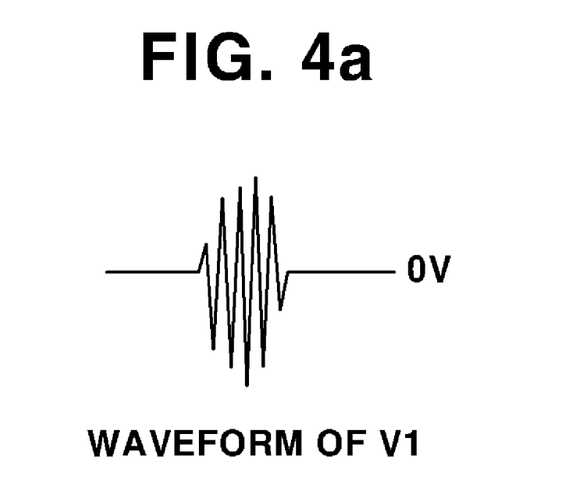
FIG. 4a, FIG. 4b, FIG. 4c, FIG. 4d, FIG. 4e, FIG. 4f, and FIG. 4g are views illustrating an example of output voltage waveform of each partial structure of an apparatus for detecting noise in a power supply of a PLC analog input/output module according to an exemplary embodiment of the present disclosure.

However, as illustrated in FIG. 4a, the capacitor (310) outputs an alternate current voltage corresponding to the noise, when the noise is included in the driving voltage.

The voltage ($V_1$) outputted from the capacitor (310) is used in order to determine whether a noised is included. Thus, the voltage ($V_1$) will be referred to as a 'noise determination target voltage'.

The voltage conversion unit (320) may convert the noise determination target voltage in an alternate current form outputted from the capacitor (310) and output the converted noise determination target voltage.

Here, the voltage conversion unit (320) may output the noise determination target voltage, by half-wave rectifying and low pass filtering the noise determination target voltage. Detailed structure and operation of the voltage conversion unit (320) will be described hereinafter.

The comparison unit (330) may compare the noise determination target voltage converted by the voltage conversion unit (320) with a reference voltage (Vref) outputted from the reference voltage generation unit (340) and may output the comparison result.

Figure 4B:
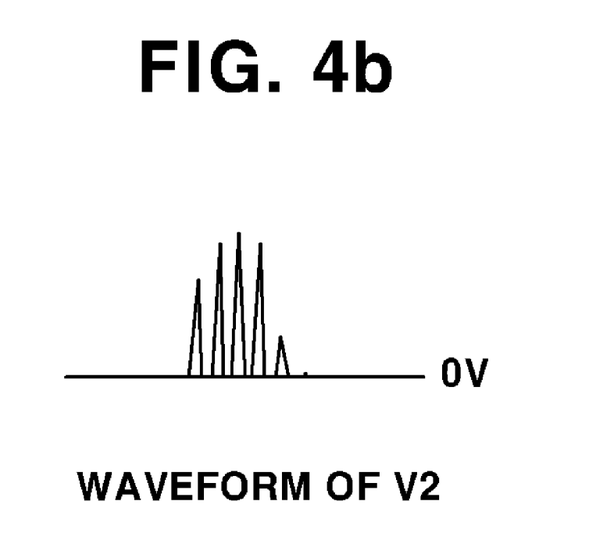
Figure 4C:
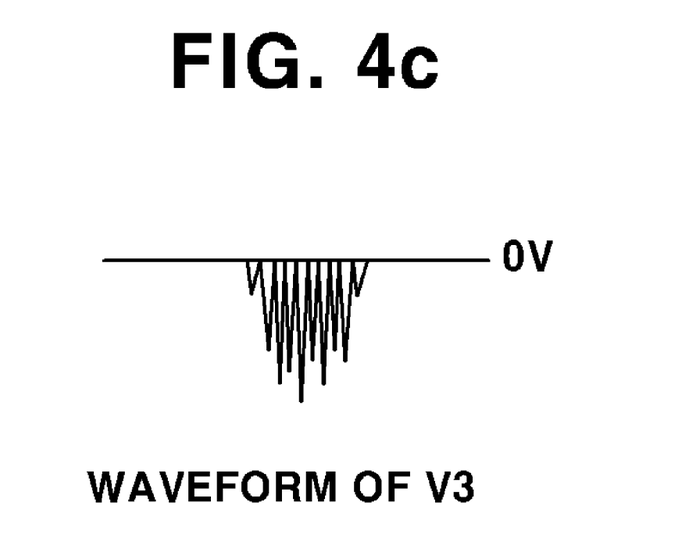
Figure 4D:
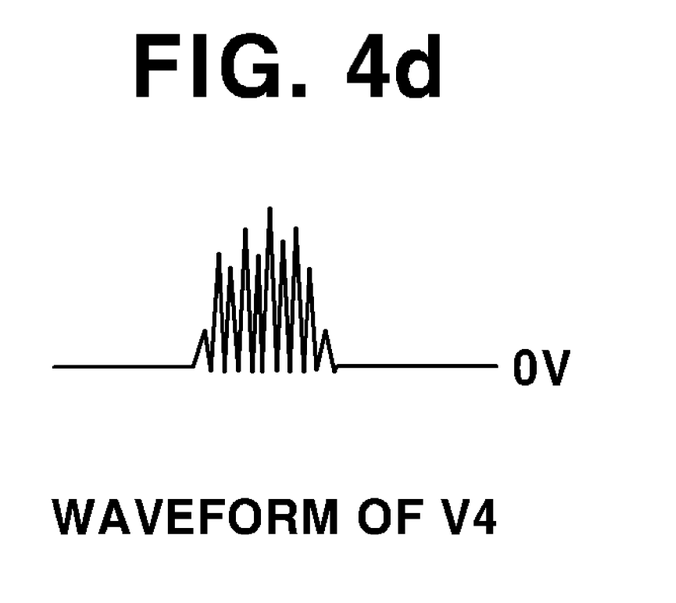
Figure 4E:
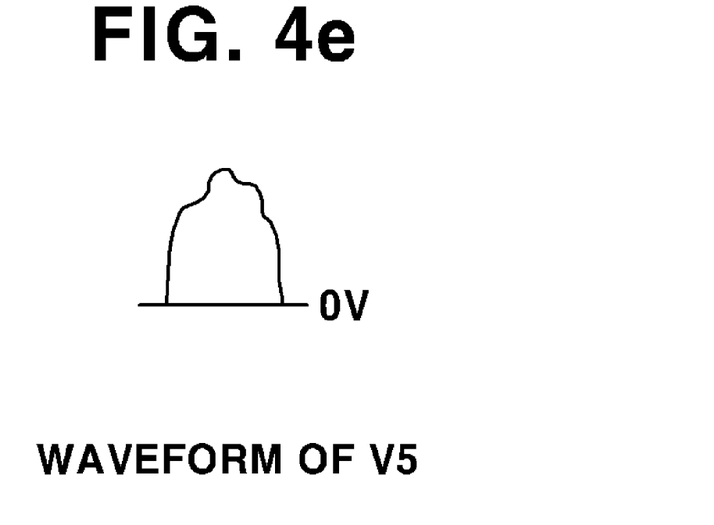
Figure 4F:
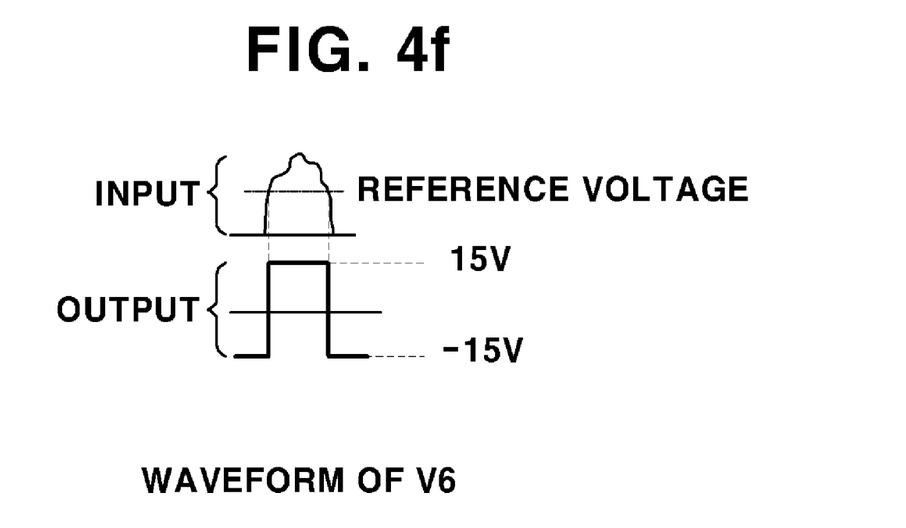

Here, as illustrated in FIG. 4f, the comparison result ($V_6$) may be a negative (−) or a positive (+) voltage. The volume of the negative (−) and the positive (+) voltage may be identical to each other.

Meanwhile, the comparison unit (330) may compare the noise determination target voltage with the reference voltage (Vref), and may output a negative (−) voltage when the noise determination target voltage is higher than the reference voltage, or output a positive (+) voltage when the noise determination target voltage is lower than the reference voltage.

Selectively, the comparison unit (330) may compare the noise determination target voltage with the reference voltage (Vref), and may output a positive (+) voltage when the noise determination target voltage is higher than the reference voltage, or output a negative (−) voltage when the noise determination target voltage is lower than the reference voltage.

The reference voltage generation unit (340) may generate a reference voltage used for the comparison unit (330) to compare with the noise determination target voltage.

The determination unit (350) may receive the comparison result outputted from the comparison unit (330), and may determine whether the noise determination target voltage is a noise and output the determination result.

Figure 4G:
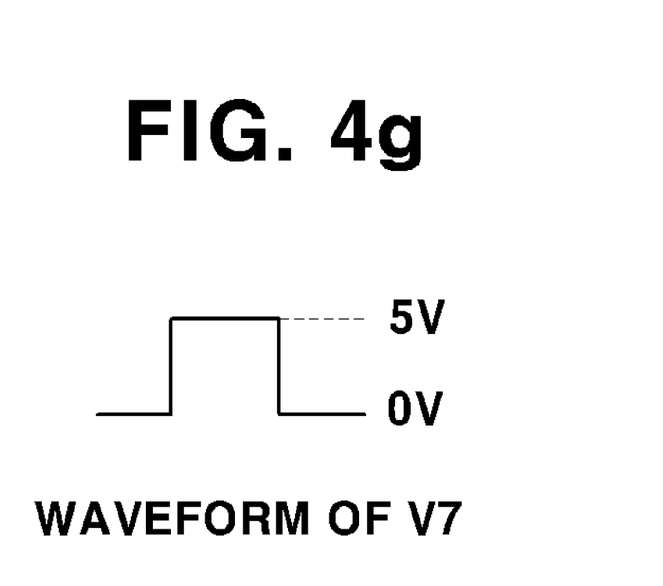

Here, as illustrated in FIG. 4g, the determination unit (350) may be configured to output voltages of different levels based on the determination result. The determination unit (350) may be an NMOS (N-channel Metal-Oxide-Semiconductor) FET (Field Effect Transistor) or a PMOS (P-channel MOS) FET.

As an example, the determination unit (350) may output a high level voltage when the comparison result received from the comparison unit (330) is a positive (+) voltage, or may output a low level voltage when the noise determination target voltage is a negative (−) voltage.

Selectively, the determination unit (350) may output a low level voltage when the comparison result received from the comparison unit (330) is a positive (+) voltage, or output a high level voltage when the noise determination target voltage is a negative (−) voltage.

Hereinafter, the structure and operation of the voltage conversion unit according to an exemplary embodiment of the present disclosure will be specifically described with reference to FIGS. 3 and 4a-4g.

The voltage conversion unit (320) according to an exemplary embodiment of the present disclosure may include a half-wave rectifier (321), an inverting adder (322), an inverting amplifier (323) and a low pass filter (324).

The half-wave rectifier (321) may half-wave rectify the noise determination target voltage having passed through the capacitor (310) (FIG. 4b). The inverting adder (322) may invert and add the noise determination target voltage that has been half-wave rectified by the half-wave rectifier (321) (FIG. 4c).

The half-wave amplifier (323) may output the noise determination target voltage inverted and added by the inverting adder (322) as a voltage in an inverted waveform of the same volume (FIG. 4b), and the low pass filter (324) may low pass filter the noise determination target voltage inverted by the inverting amplifier (323) (FIG. 4e).

Hereinafter, the structure requiring supplementary descriptions in the voltage conversion unit (320) will be further described. Descriptions for the generally used structure will be omitted.

The half-wave rectifier (321) may include first and second resistors (R1, R2), a first opi-amp (321a), first and second diodes (D1, D2).

Here, a negative (−) input terminal the first opi-amp (321a) may be connected to the capacitor (310) and a positive (+) input terminal may be earthed. The first resistor (R1) may be connected between a negative (−) input terminal of the first opi-amp (321a) and the capacitor (310).

An anode of the first diode (D1) may be connected between a negative (−) input terminal of the first opi-amp (321a) and the first resistor (R1), and a cathode of the first diode (D1) may be connected to an output terminal of the first opi-amp (321a).

In addition, an anode of the second diode (D2) may be connected to an output terminal of the first opi-amp (321a), and a cathode of the second diode (D2) may be connected to an output side of the half-wave rectifier (321).

Meanwhile, a side of the second resistor (R2) may be connected between the first resistor (R1) and the first opi-amp (321a), and another side of the second resistor (R2) may be an output side of the half-wave rectifier (321). Thus, the second resistor (R2) may be connected to an anode of the first diode (D1) and a cathode of the second diode (D2).

When looking at operations of the half-wave rectifier (321) having such structure, in the case where the first resistor (R1) and the second resistor (R2) are set as the same value, and when the noise determination target voltage (V1) is higher than zero (0), the first diode (D1) is turned on and the second diode (D2) is turned off so that the output voltage (V2) of the half-wave rectifier (321) becomes zero (0).

Contrariwise, when the noise determination target voltage (V1) is lower than zero (0), the first diode (D1) is turned off and the second diode (D2) is turned on, so that the output voltage (V2) of the half-wave rectifier (321) becomes −V1 according to the following Equation 1.

$$V_2 = -\frac{R_2}{R_1}V_1 = -V_1 \qquad \text{[Equation 1]}$$

Therefore, the polarity of an area where the noise determination target voltage (V1) is under zero (0) may be changed and outputted as an output voltage (V2) of the half-wave rectifier (321).

Meanwhile, the inverting adder (322) may include third to fifth resistors (R3, R4, R5) and a second opi-amp (322a).

A negative (−) input terminal of the second opi-amp (322a) may be connected to an output terminal of the half-wave rectifier (321), and a positive (+) input terminal of the second opi-amp (322a) may be earthed.

The third resistor (R3) may be connected between negative (−) input terminals of the capacitor (310) and the second opi-amp (322a), the fourth resistor (R4) may be connected between an output terminal of the second opi-amp (322a) and a negative (−) input terminal of the second opi-amp (322a), and the fifth resistor (R5) may be connected between an output side of the half-wave rectifier (321) and a negative (−) input terminal of the second opi-amp (322a).

When looking at operations of the inverting adder (322) having such structure, in the case where R3=R4 and R5=2R4, the output voltage (V3) of the inverting adder (322) may be determined according to the following Equation 2.

$$V_3 = -\left(\frac{R_4}{R_3}V_1 + \frac{R_4}{R_5}V_2\right) = -(V_1 + 2V_2) \qquad \text{[Equation 2]}$$

Therefore, $V_2=0$ when the noise determination target voltage ($V_1$) is higher than zero (0), and therefore $V_3=-V_1$. In addition, $V_2=-V_1$ when the noise determination target voltage ($V_1$) is lower than zero (0), and therefore $V_3=V_1$.

To conclude, the output voltage ($V_3$) of the inverting adder (322) may be outputted as a negative (−) waveform in the same volume as that of the noise determination target voltage ($V_1$). The inverting amplifier (323) may invert the output voltage ($V_3$) as a positive (+) waveform and output the inverted output voltage.

Although an apparatus for detecting noise in a power supply of a PLC analog input/output module according to the present disclosure have been described with reference to a number of illustrative exemplary embodiments thereof, it should be understood that numerous other modifications and alternative embodiments can be devised by those skilled in the art that will fall within the spirit and scope of the principles of this invention. More particularly, various variations and modifications are possible in the component parts and/or arrangements of the subject combination arrangement within the scope of the disclosure, the drawing and the appended claims. In addition to variations and modifications in the component parts and/or arrangements, alternative uses will also be apparent to those skilled in the art.

Therefore, the abovementioned exemplary embodiments and enclosed drawings are intended to be illustrative, and not to limit the scope of the claims. The scope of protection of the present disclosure is to be interpreted by the following claims, and that all the technical ideas within the equivalent scope of the scope of the present disclosure should be construed as being included.

What is claimed is:

1. An apparatus for detecting noise in a power supply of a PLC analog input/output module, the apparatus comprising:
    a capacitor configured to extract a noise determination target voltage from a driving voltage outputted from the power supply;
    a voltage conversion unit configured to convert the noise determination target voltage outputted from the capacitor and to output the converted noise determination target voltage;
    a comparison unit configured to compare the noise determination target voltage converted by the voltage conversion unit with a reference voltage; and
    a determination unit configured to determine whether the noise determination target voltage is a noise, based on a comparison result by the comparison unit,
    wherein the voltage conversion unit includes:
    a half-wave rectifier configured to half-wave rectify the noise determination target voltage outputted from the capacitor;
    an inverting adder configured to invert and add the noise determination target voltage half-wave rectified by the half-wave rectifier;
    an inverting amplifier configured to output the noise detection determination target voltage inverted and added by the inverting adder in an inversed form of a same size; and
    a low pass filter configured to low-pass filter the noise determination target voltage inverted by the inverting amplifier, and
    wherein the half-wave rectifier includes a first resistor, a second resistor, an op-amp, a first diode and a second diode.

2. The apparatus of claim 1, wherein the comparison unit outputs a positive voltage or a negative voltage when the noise determination target voltage is higher than the reference voltage, or outputs a negative voltage or a positive voltage when the noise determination target voltage is lower than the reference voltage.

3. The apparatus of claim 2, wherein the determination unit outputs a high level voltage or a low level voltage when the noise determination target voltage is determined to be a noise, or outputs a low level voltage or a high level voltage when the noise determination target voltage is determined not to be a noise.

4. The apparatus of claim 1, wherein the determination unit is an NMOS (N-channel Metal-Oxide-Semiconductor) FET (Field Effect Transistor) or a PMOS (P-channel MOS) FET configured to be turned on or turned off, according to the comparison result outputted from the comparison unit.

5. The apparatus of claim 1, wherein a negative (−) input terminal of the op-amp is connected to the capacitor and a positive (+) input terminal is earthed, the first resistor is connected between the negative (−) input terminal of the op-amp and the capacitor, an anode of the first diode is connected between the negative (−) input terminal of the op-amp and the first resistor, a cathode of the first diode is connected to an output terminal of the op-amp, an anode of the second diode is connected to the output terminal of the op-amp, a cathode of the second diode is connected to an output side of the half-wave rectifier, a side of the second resistor is connected between the first resistor and the op-amp, and another side of the second resistor is connected to the output side of the half-wave rectifier.

6. The apparatus of claim 1, wherein the determination unit outputs a high level voltage or a low level voltage when the noise determination target voltage is determined to be a noise, or outputs a low level voltage or a high level voltage when the noise determination target voltage is determined not to be a noise.

* * * * *